US012685027B2

(12) United States Patent
Motoyama et al.

(10) Patent No.: US 12,685,027 B2
(45) Date of Patent: Jul. 14, 2026

(54) MRAM STRUCTURE WITH RAISED EDGE OF TUNNEL BARRIER LAYER

(71) Applicant: INTERNATIONAL BUSINESS MACHINES CORPORATION, Armonk, NY (US)

(72) Inventors: Koichi Motoyama, Clifton Park, NY (US); Oscar van der Straten, Guilderland Center, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 574 days.

(21) Appl. No.: 17/814,243

(22) Filed: Jul. 22, 2022

(65) Prior Publication Data

US 2024/0032435 A1     Jan. 25, 2024

(51) Int. Cl.
| | |
|---|---|
| *H10N 50/10* | (2023.01) |
| *G11C 11/16* | (2006.01) |
| *H10B 61/00* | (2023.01) |
| *H10N 50/01* | (2023.01) |
| *H10N 50/80* | (2023.01) |

(52) U.S. Cl.
CPC ........... *H10N 50/10* (2023.02); *G11C 11/161* (2013.01); *H10B 61/00* (2023.02); *H10N 50/01* (2023.02); *H10N 50/80* (2023.02)

(58) Field of Classification Search
CPC ........ H10N 50/10; H10N 50/80; H10N 50/01; H10B 61/00; G11C 11/161
USPC ........................................................ 257/252
See application file for complete search history.

(56) References Cited

U.S. PATENT DOCUMENTS

| | | | |
|---|---|---|---|
| 8,048,685 B2 | 11/2011 | Boivin | |
| 8,557,610 B2 | 10/2013 | Chen | |
| 9,406,875 B2 | 8/2016 | Li | |
| 9,553,257 B1 | 1/2017 | Annunziata | |
| 9,711,713 B1 | 7/2017 | Chou | |

(Continued)

FOREIGN PATENT DOCUMENTS

| | | |
|---|---|---|
| CN | 113451353 A | 9/2021 |

OTHER PUBLICATIONS

Thiam et al., "Patterning challenges for beyond 3nm logic devices: Example of an Interconnected Magnetic Tunnel Junction", Conference Paper Feb. 2019, 15 pages.

(Continued)

*Primary Examiner* — Norman D Richards
*Assistant Examiner* — Colin Russell Mccutcheon
(74) *Attorney, Agent, or Firm* — Yuanmin Cai

(57) ABSTRACT

Embodiments of present invention provide a method of forming a MRAM structure. The method includes patterning a bottom electrode layer and a first ferromagnetic layer on top of the bottom electrode layer; depositing a dielectric layer, the dielectric layer covering the bottom electrode layer and the first ferromagnetic layer; creating an opening in the dielectric layer, the opening exposing a portion of the first ferromagnetic layer; forming a tunnel barrier layer inside the opening; forming a second ferromagnetic layer on top of the tunnel barrier layer; patterning the tunnel barrier layer and the second ferromagnetic layer; and forming a top electrode layer on top of the second ferromagnetic layer. Structures formed thereby are also provided.

16 Claims, 11 Drawing Sheets

(56) References Cited

U.S. PATENT DOCUMENTS

| | | | |
|---|---|---|---|
| 11,088,201 B2 | 8/2021 | Lin | |
| 2016/0308119 A1 | 10/2016 | Hsu | |
| 2017/0062520 A1 | 3/2017 | Sato | |
| 2019/0214546 A1 * | 7/2019 | Ha | H10N 50/01 |
| 2020/0098982 A1 * | 3/2020 | Chuang | H01L 23/528 |
| 2020/0403144 A1 | 12/2020 | Kuo-Chih | |
| 2021/0091300 A1 * | 3/2021 | Doris | H10D 1/20 |
| 2022/0310902 A1 * | 9/2022 | Wang | H10B 61/00 |

OTHER PUBLICATIONS

Van Beek et al., "Edge-induced reliability & performance degrada-
tion in STT-MRAM: an etch engineering solution", Conference
Paper Mar. 2021, © 2021 IEEE, 6 pages.

* cited by examiner

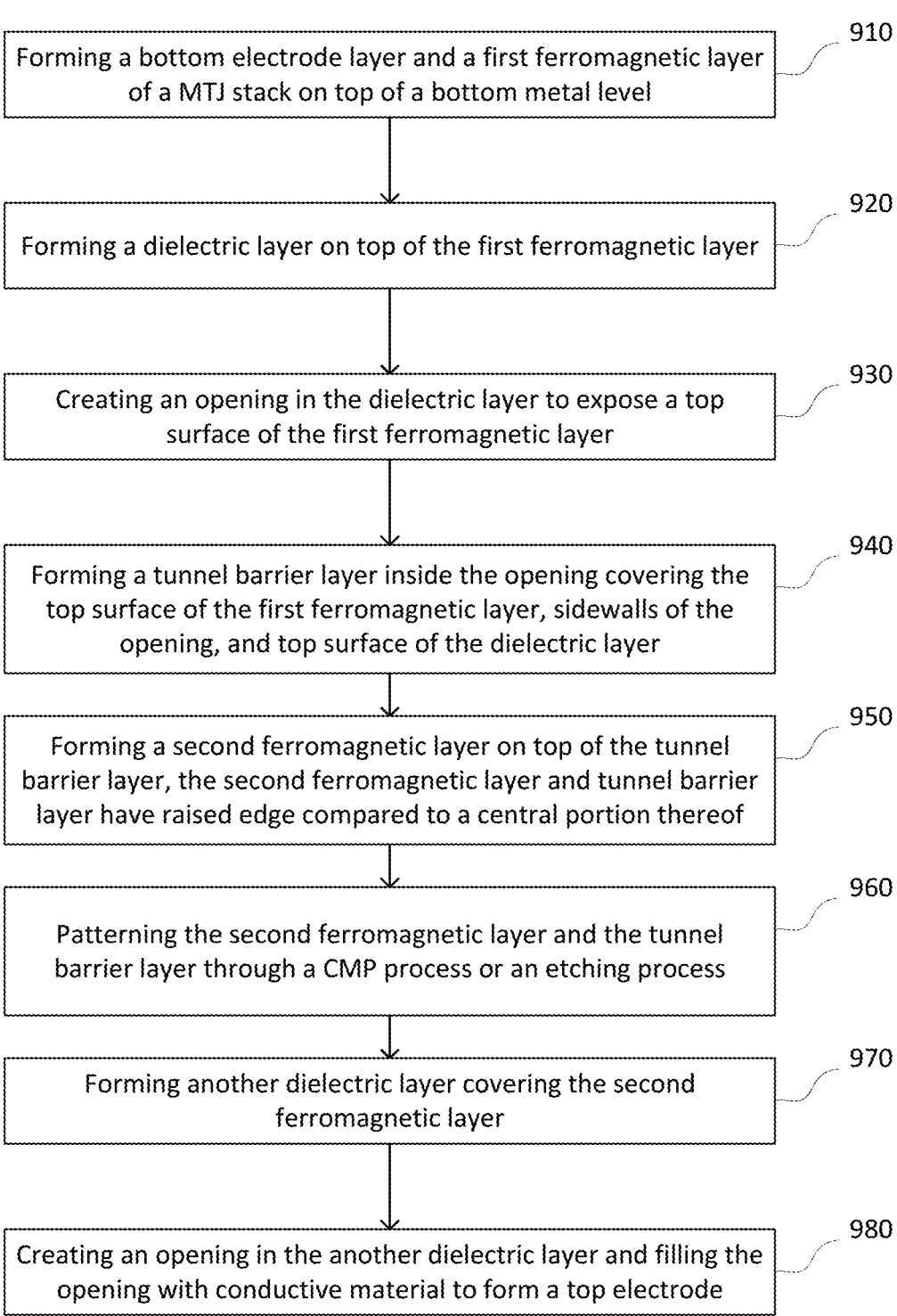

910 — Forming a bottom electrode layer and a first ferromagnetic layer of a MTJ stack on top of a bottom metal level 920 — Forming a dielectric layer on top of the first ferromagnetic layer 930 — Creating an opening in the dielectric layer to expose a top surface of the first ferromagnetic layer 940 — Forming a tunnel barrier layer inside the opening covering the top surface of the first ferromagnetic layer, sidewalls of the opening, and top surface of the dielectric layer 950 — Forming a second ferromagnetic layer on top of the tunnel barrier layer, the second ferromagnetic layer and tunnel barrier layer have raised edge compared to a central portion thereof 960 — Patterning the second ferromagnetic layer and the tunnel barrier layer through a CMP process or an etching process 970 — Forming another dielectric layer covering the second ferromagnetic layer 980 — Creating an opening in the another dielectric layer and filling the opening with conductive material to form a top electrode

FIG. 21

MRAM STRUCTURE WITH RAISED EDGE OF TUNNEL BARRIER LAYER

BACKGROUND

The present application relates to manufacturing of semiconductor integrated circuits. More particularly, it relates to method of forming a magnetoresistive random access memory and the structure formed thereby.

With the explosion of digital information, semiconductor memory devices are playing an ever increasingly important role in the managing and organizing of this digital information through storing, retrieving, and/or transformation of this digital information. Magnetoresistive random-access memory (MRAM) is a type of non-volatile memory (NVM) capable of holding saved data even in the event that power to the memory is down or is accidentally cut off. There have been several recent developments in the technology that allow MRAM devices to be used successfully in specific emerging applications, as well as in not-so-new ones.

MRAM technology is based on a component known as magnetic tunnel junction (MTJ) that consists of two ferromagnetic layers separated by an insulating layer known as a tunnel barrier layer. In a vertical MRAM device, a top and a bottom electrode compliment the MTJ to form a vertical MTJ stack. The vertical MTJ stack is usually formed by the patterning of a stack of blanket layers corresponding to the above MTJ stack. In other words, the stack of blanket layers may be etched through a reactive ion etch (RIE) and/or ion beam etching (IBE) process. However, such etching process may sometimes come with re-sputtering effect, which causes metal elements from, for example, the blanket bottom electrode layer to be re-deposited onto sidewall surfaces of the ferromagnetic layers and/or the tunnel barrier layer that are above the bottom electrode layer, resulting shorts between the two ferromagnetic layers that should be otherwise isolated from each other by the tunnel barrier layer.

SUMMARY

Embodiments of present invention provide a magnetoresistive random-access memory (MRAM) structure. The MRAM structure includes a magnetic tunnel junction (MTJ) stack, the MTJ stack including, vertically from a bottom to a top thereof, a bottom electrode layer, a first ferromagnetic layer, a tunnel barrier layer, a second ferromagnetic layer, and a top electrode layer, wherein the second ferromagnetic layer is directly on top of the tunnel barrier layer and has a sidewall, and a peripheral portion of the tunnel barrier layer surrounds at least a first portion of the sidewall of the second ferromagnetic layer.

In one embodiment, the first ferromagnetic layer has a sidewall, and the sidewall of the first ferromagnetic layer is not coplanar with the sidewall of the second ferromagnetic layer.

In another embodiment, the sidewall of the second ferromagnetic layer is angled relative to a bottom surface of the second ferromagnetic layer, forming an obtuse angle between about 120 degrees and about 150 degrees.

In yet another embodiment, the first ferromagnetic layer is a reference layer of the MTJ stack and the second ferromagnetic layer is a free layer of the MTJ stack.

In one embodiment, the sidewall of the second ferromagnetic layer has a second portion that is not surrounded by the tunnel barrier layer and is not coplanar with the first portion of the sidewall of the second ferromagnetic layer.

According to one embodiment, the MTJ stack of the MRAM structure further includes a metal hard mask layer between the second ferromagnetic layer and the top electrode layer.

Embodiments of present invention also provide a method of forming a MRAM structure. The method includes patterning a bottom electrode layer and a first ferromagnetic layer on top of the bottom electrode layer; depositing a dielectric layer, the dielectric layer covering the bottom electrode layer and the first ferromagnetic layer; creating an opening in the dielectric layer, the opening exposing a portion of the first ferromagnetic layer; forming a tunnel barrier layer inside the opening in the dielectric layer; forming a second ferromagnetic layer on top of the tunnel barrier layer; patterning the tunnel barrier layer and the second ferromagnetic layer; and forming a top electrode layer on top of the second ferromagnetic layer.

In one embodiment, forming the tunnel barrier layer includes forming a central portion of the tunnel barrier layer on top of the exposed portion of the first ferromagnetic layer and forming a peripheral portion of the tunnel barrier layer against a sidewall of the opening in the dielectric layer, wherein the sidewall is angled relative to the exposed portion of the first ferromagnetic layer to have an obtuse angle between about 120 degrees to about 150 degrees.

In one embodiment, patterning the tunnel barrier layer and the second ferromagnetic layer includes applying a chemical-mechanic-polishing process to remove portions of the second ferromagnetic layer and the tunnel barrier layer that are above a top surface of the dielectric layer.

In another embodiment, patterning the tunnel barrier layer and the second ferromagnetic layer includes forming a metal hard mask layer covering a portion of the second ferromagnetic layer and the tunnel barrier layer, and selectively removing the second ferromagnetic layer and the tunnel barrier layer not covered by the metal hard mask layer through an anisotropic etching process.

In one embodiment, the method further includes, before depositing the dielectric layer, forming a conformal liner, the conformal liner covers a top surface of the first ferromagnetic layer and sidewalls of the first ferromagnetic layer and the bottom electrode layer.

In another embodiment, the method further includes, before forming the tunnel barrier layer, forming a sidewall spacer at a sidewall of the opening in the dielectric layer.

BRIEF DESCRIPTION OF THE DRAWINGS

The present invention will be understood and appreciated more fully from the following detailed description of embodiments of present invention, taken in conjunction with accompanying drawings of which:

FIG. 21 is a demonstrative illustration of a flow-chart of a method of manufacturing a MRAM structure according to embodiments of present invention.

Figure 1:
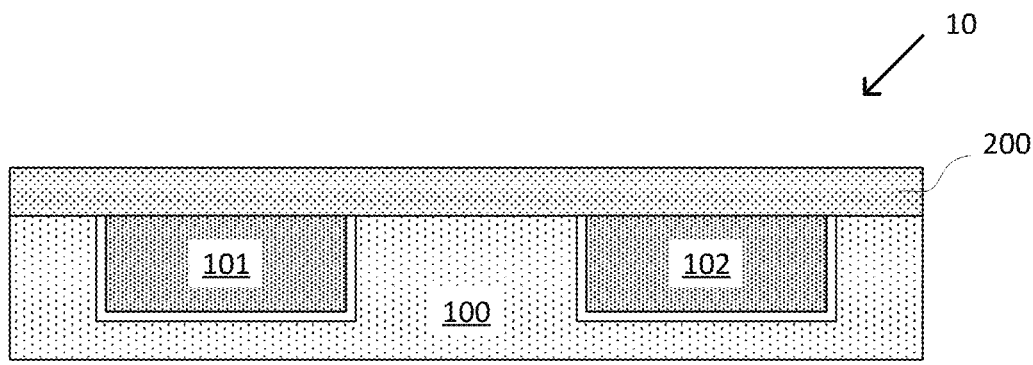
FIGS. 1-8 are demonstrative illustrations of cross-sectional views of a MRAM structure in a process of manufacturing thereof according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a MRAM structure in a step of manufacturing thereof according to one embodiment of present invention. In one embodiment, the MRAM structure may include MTJ stacks and the MTJ stacks may be in a substantially cylindrical form or shape. Cross-sectional views illustrated hereinafter may be views of cross-sections made substantially along a diameter of the cylindrical form or shape of the MTJ stacks of the MRAM structure.

More particularly, embodiments of present invention provide forming one or more bottom contacts of a MRAM structure 10 such as bottom contacts 101 and 102 in a first dielectric layer 100. The bottom contacts 101 and 102 may be part of a metal level such as, for example, a metal level M2, M3, etc. and the first dielectric layer 100 may be an interlevel dielectric (ILD) layer. The bottom contacts 101 and 102, together with the first dielectric layer 100, may be part of a back-end-of-line (BEOL) structure.

Embodiments of present invention may further provide forming a blanket bottom electrode layer 200 of the MRAM structure 10 on top of the bottom contacts 101 and 102 and the first dielectric layer 100. In one embodiment, the blanket bottom electrode layer 200 may be a layer of tantalum-nitride (TaN) or titanium-nitride (TiN). The blanket bottom electrode layer 200 may be formed through a physical-vapor-deposition (PVD) process, a chemical-vapor-deposition (CVD) process, an atomic-layer-deposition (ALD) process, or any other suitable means, to have a thickness ranging from about 20 nm to about 100 nm.

Figure 2:
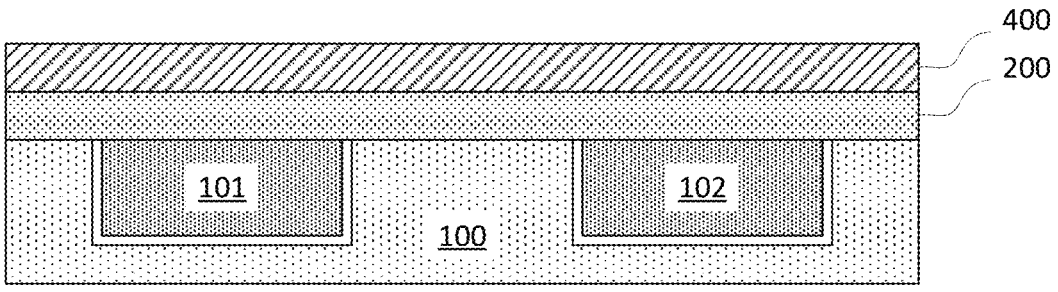

FIG. 2 is a demonstrative illustration of cross-sectional view of a MRAM structure in a step of manufacturing thereof, following the step illustrated in FIG. 1, according to one embodiment of present invention. More particularly, embodiments of present invention provide forming a blanket first ferromagnetic layer 400 on top of the blanket bottom electrode layer 200. In one embodiment, the blanket first ferromagnetic layer 400 may be a layer of cobalt (Co), iron (Fe) and boron (B) based material (CoFeB) such as, for example, an alloy of Co, Fe, and B, although other types of ferromagnetic materials may be used as well. The blanket first ferromagnetic layer 400 may be formed through, for example, a PVD, a CVD process, an ALD process, or any other suitable means to have a thickness ranging from about 2 nm to about 30 nm.

Figure 3:
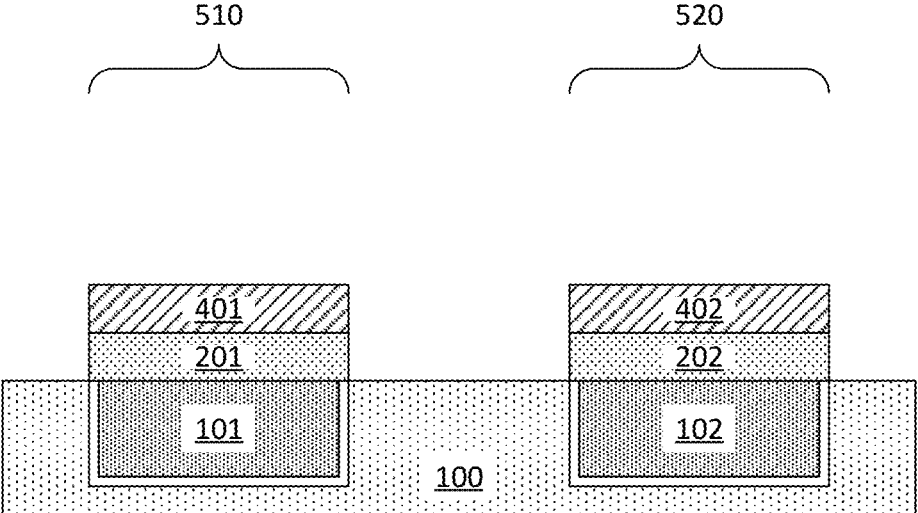

FIG. 3 is a demonstrative illustration of cross-sectional view of a MRAM structure in a step of manufacturing thereof, following the step illustrated in FIG. 2, according to one embodiment of present invention. More particularly, embodiments of present invention provide patterning the blanket bottom electrode layer 200 and the blanket first ferromagnetic layer 400 into a bottom electrode layer 201 (and 202) and a first ferromagnetic layer 401 (and 402) on top thereof, respectively, through a lithographic patterning and etching process. Here, it is to be noted that the bottom electrode layer 201 (and 202) and the bottom contact 101 (and 102) may sometimes together be referred to as a bottom electrode or a bottom electrode layer. Furthermore, for the sake of description hereinafter, although two MTJ stacks 510 and 520 are demonstratively illustrated, description may be focused sometimes on one of the MTJ stacks such as, for example, the MTJ stack 510. Nevertheless, similar description may be applied to other MTJ stacks such as, for example, the MTJ stack 520.

Figure 4:
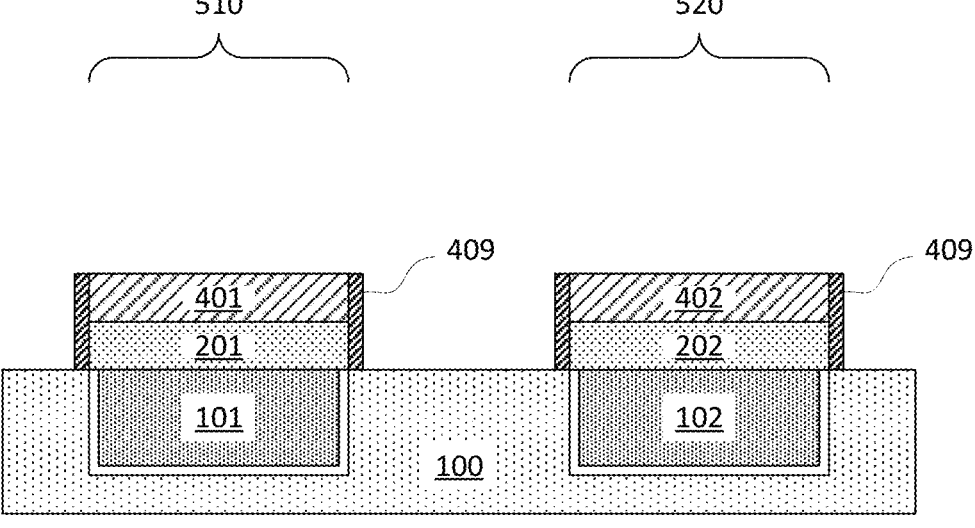

FIG. 4 is a demonstrative illustration of cross-sectional view of a MRAM structure in a step of manufacturing thereof, following the step illustrated in FIG. 3, according to one embodiment of present invention. More particularly, embodiments of present invention provide forming a conformal liner 409 covering a top surface of the first ferromagnetic layers 401 and 402, sidewalls of the first ferromagnetic layers 401 and 402, sidewalls of the bottom electrode layers 201 and 202, and a top surface of the first dielectric layer 100. The deposition of the conformal liner 409 may be followed by an anisotropic and directional etching process to remove horizontal portions of the conformal liner 409, thereby exposing the top surface of the first ferromagnetic layers 401 and 402 and the top surface of the first dielectric layer 100, and forming the spacer shaped conformal liner 409 as illustrated in FIG. 4. The conformal liner 409 may be a layer of silicon-nitride (SiN), silicon-carbonitride (SiCN), or any other suitable materials. In addition, in one embodiment, the conformal liner 409 may prevent surrounding dielectric materials, to be formed later, from potentially being contaminated by materials of the first ferromagnetic layers 401 and 402 and the bottom electrode layers 201 and 202.

Figure 5:
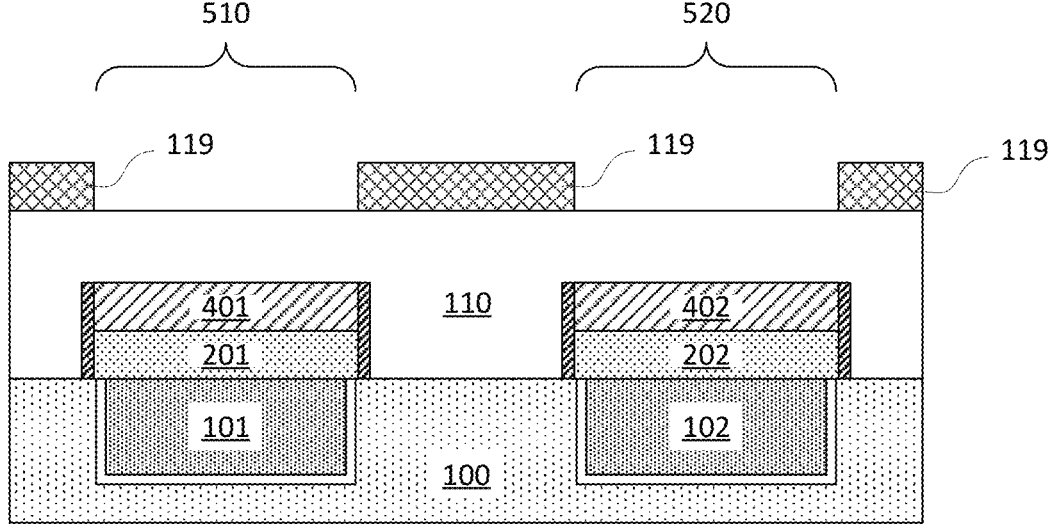

FIG. 5 is a demonstrative illustration of cross-sectional view of a MRAM structure in a step of manufacturing thereof, following the step illustrated in FIG. 4, according to one embodiment of present invention. More particularly, embodiments of present invention provide depositing a second dielectric layer 110 covering the first ferromagnetic layers 401 and 402 and the bottom electrode layers 201 and 202. The second dielectric layer 110 may be deposited to have a height, above a top surface of the first ferromagnetic layers 401 and 402 such that openings may subsequently be created within a portion of the second dielectric layer 110 above the first ferromagnetic layers 401 and 402, as being described below in more details. The second dielectric layer 110 may be deposited through, for example, a CVD process. After the deposition, the second dielectric layer 110 may be planarized through, for example, a chemical-mechanic-polishing (CMP) process to have a flat top surface.

Next, a hard mask layer 119 may be formed on top of the second dielectric layer 110. The hard mask layer 119 may be formed through a lithographic patterning process and may include lithographic patterns such as, for example, openings that correspond to the MTJ stacks 510 and 520. In one embodiment, the openings of the hard mask layer 119 may be aligned to the underlining first ferromagnetic layers 401 and 402, which may be made possible through the use of alignment marks during their patterning process. The openings of the hard mask layer 119 may have area sizes that are equal to or, in some embodiments, slightly smaller than the top surface areas of the first ferromagnetic layers 401 and 402.

Figure 6:
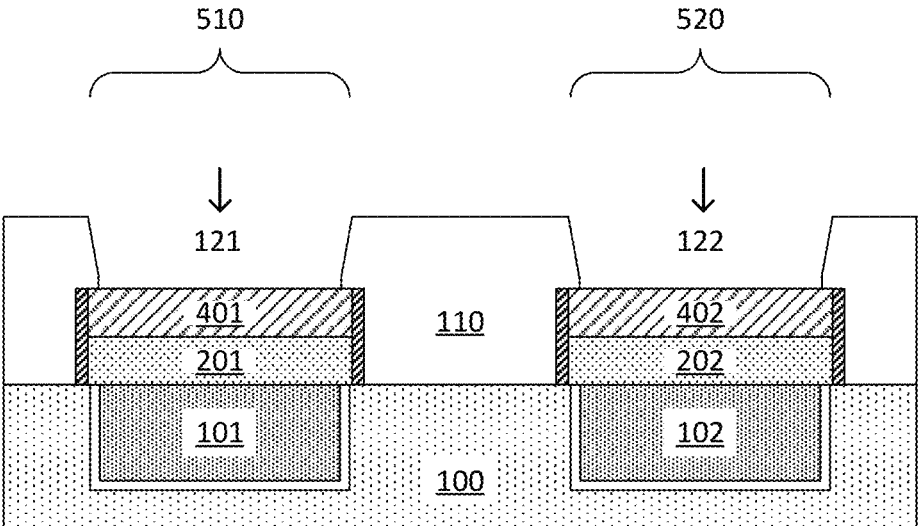

FIG. 6 is a demonstrative illustration of cross-sectional view of a MRAM structure in a step of manufacturing thereof, following the step illustrated in FIG. 5, according to one embodiment of present invention. More particularly, embodiments of present invention may provide transferring the lithographic patterns of the hard mask layer 119 into the second dielectric layer 110. The transferring of the lithographic patterns of the hard mask layer 119 may be made through, for example, a selective and/or directional etching process such as a reactive-ion-etching (RIE) and/or ion-beam etching (IBE) process. More specifically, the transferring of the lithographic patterns may create openings 121 and 122 in the second dielectric layer 110 above the first ferromagnetic layers 401 and 402.

In one embodiment, the openings 121 and 122 may be smaller than the top surfaces of the first ferromagnetic layers 401 and 402, and thus may only expose a portion of the first ferromagnetic layers 401 and 402. In another embodiment, sidewalls of the openings 121 and 122 may not be perpendicular to the bottom of the openings or perpendicular to the top surfaces of the first ferromagnetic layers 401 and 402. For example, in one embodiment, the sidewalls of the openings 121 and 122 may be angled relative to the top surfaces of the first ferromagnetic layers 401 and 402. Specifically, the sidewalls of the openings 121 and 122 may form an obtuse angle ranging from about 120 degrees to about 150 degrees relative to the exposed portions or top surfaces of the first ferromagnetic layers 401 and 402. According to one embodiment, forming the openings 121 and 122 with angled sidewalls helps reduce shorts and tunnel barrier feature coverage.

Figure 7:
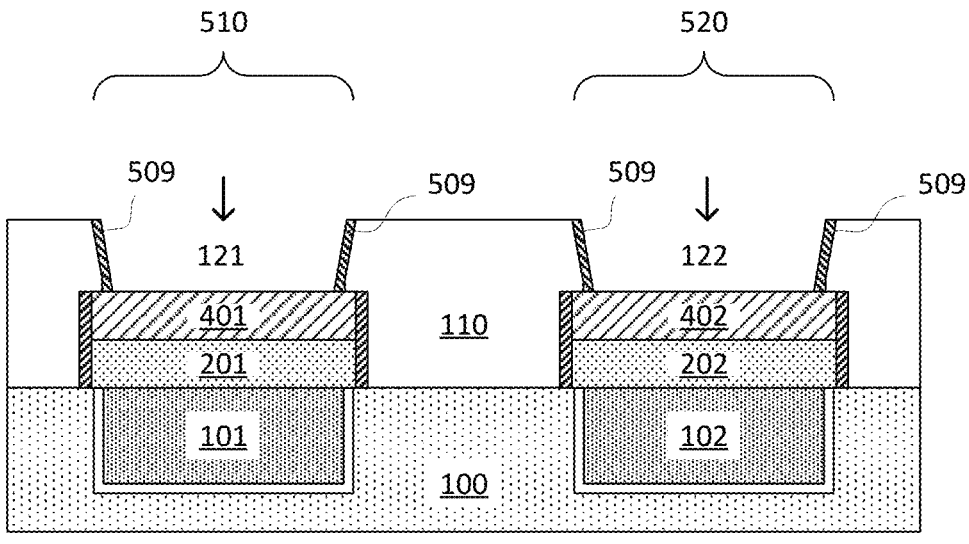

FIG. 7 is a demonstrative illustration of cross-sectional view of a MRAM structure in a step of manufacturing thereof, following the step illustrated in FIG. 6, according to one embodiment of present invention. More particularly, embodiments of present invention provide forming a first sidewall spacer 509 lining sidewalls of the openings 121 and 122 but leaving the top surfaces of the first ferromagnetic layers 401 and 402 exposed. For example, in forming the first sidewall spacer 509, a conformal layer of dielectric material such as, for example, SiN, SiCN, or SiO may initially be deposited to cover the exposed top surfaces of the first ferromagnetic layers 401 and 402 and the surrounding second dielectric layer 110. The deposition of the conformal dielectric layer may be followed by a directional or anisotropic etching process. The anisotropic etching process removes a first portion of the conformal dielectric layer that are substantially horizontal and leaves a second portion of the conformal dielectric layer that are non-horizontal, such as the angled portion thereof, substantially un-etched. The angled portion of the conformal dielectric layer then remains at sidewalls of the openings 121 and 122 of the second dielectric layer 110 as the first sidewall spacer 509.

Figure 8:
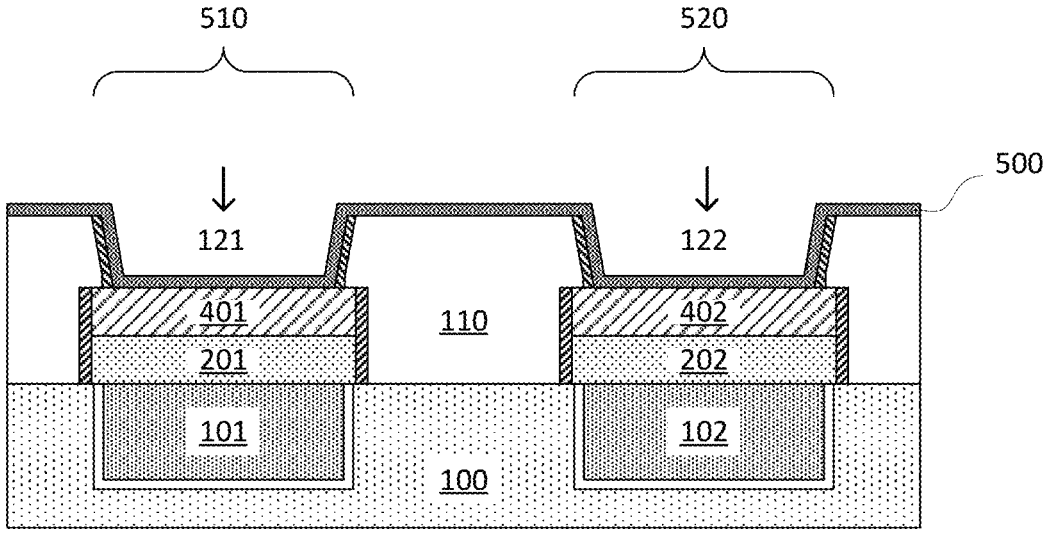

FIG. 8 is a demonstrative illustration of cross-sectional view of a MRAM structure in a step of manufacturing thereof, following the step illustrated in FIG. 7, according to one embodiment of present invention. More particularly, embodiments of present invention provide forming a blanket tunnel barrier layer 500 on top of the second dielectric layer 110 and the first ferromagnetic layers 401 and 402 exposed by the openings 121 and 122. The blanket tunnel barrier layer 500 may be a layer of magnesium oxide (MgO) or other suitable materials including, for example, $Al_2O_3$, $TiO_2$ and may be formed to have a thickness of about 0.6 nm to about 1.2 nm. The thickness of the blanket tunnel barrier layer 500 may be significantly less than a depth of the openings 121 and 122 that is measured from a top surface of the first ferromagnetic layers 401 and 402 to the top surface of the second dielectric layer 110. For example, the depth of the openings 121 and 122 may be about 5 nm to about 50 nm. In other words, the blanket tunnel barrier layer 500 may only partially fill the openings 121 and 122. The blanket tunnel barrier layer 500 may have a central portion directly on top of the first ferromagnetic layers 401 and 402, and a peripheral portion that lines the sidewalls of the openings 121 and 122 and surrounded by the first sidewall spacer 509.

FIGS. 9-14 are demonstrative illustrations of cross-sectional views of a MRAM structure in a process of manufacturing thereof, following the steps illustrated in FIGS. 1-8, according to one embodiment of present invention.

Figure 9:
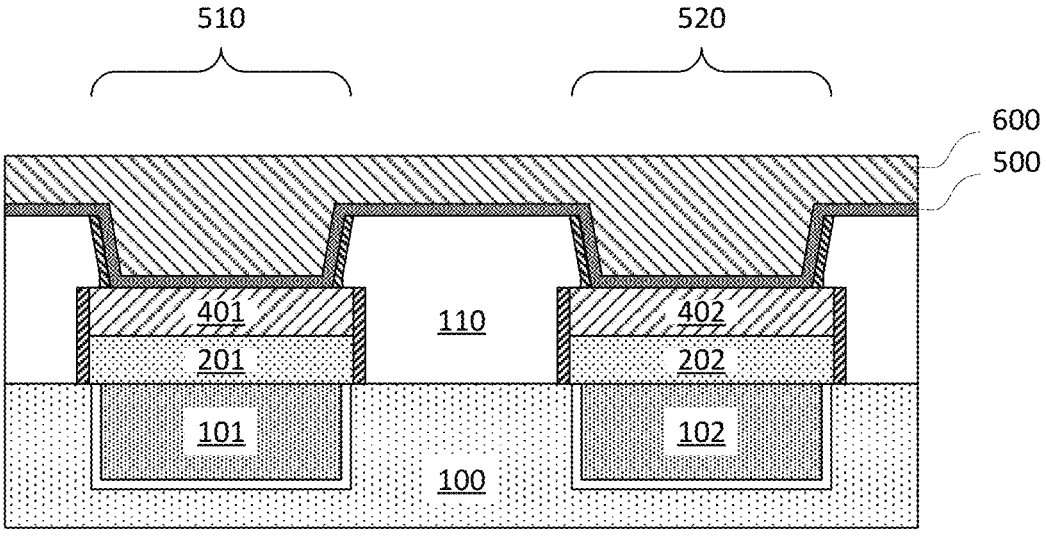
FIGS. 9-14 are demonstrative illustrations of cross-sectional views of a MRAM structure in a process of manufacturing thereof, following the steps illustrated in FIGS. 1-8, according to one embodiment of present invention.

More particularly, FIG. 9 is a demonstrative illustration of cross-sectional view of a MRAM structure in a step of manufacturing thereof, following the step illustrated in FIG.

8, according to one embodiment of present invention. For example, embodiments of present invention provide forming a blanket second ferromagnetic layer 600 on top of the blanket tunnel barrier layer 500. In one embodiment, the blanket second ferromagnetic layer 600 may be a layer of alloy made of Co, Fe, and B, although other types of ferromagnetic material may be used as well. The blanket second ferromagnetic layer 600 may be formed through a deposition process, such as a PVD or CVD or ALD process, to fully fill the openings 121 and 122. In other words, the blanket second ferromagnetic layer 600 may be formed to have a height that is above a top surface of the second dielectric layer 110.

Figure 10:
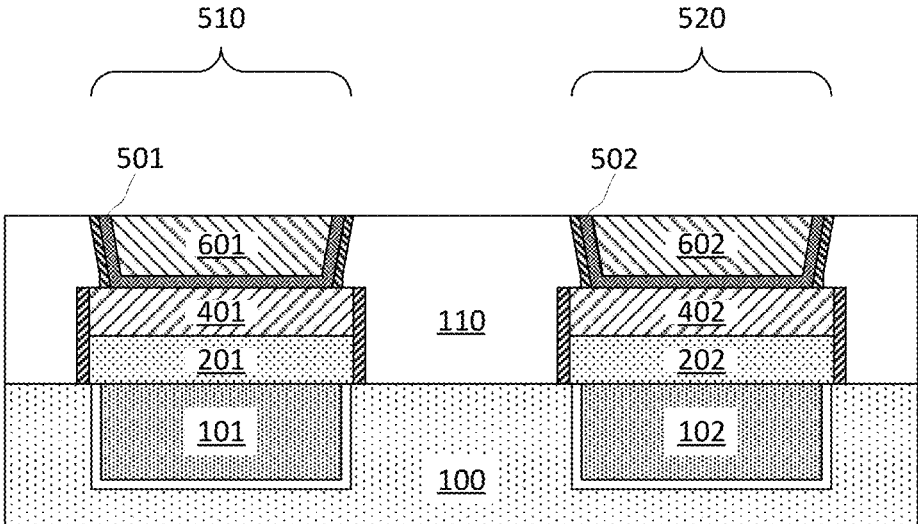

FIG. 10 is a demonstrative illustration of cross-sectional view of a MRAM structure in a step of manufacturing thereof, following the step illustrated in FIG. 9, according to one embodiment of present invention. More particularly, embodiments of present invention provide removing excess materials of the blanket second ferromagnetic layer 600 and the blanket tunnel barrier layer 500 that are above the top surface of the second dielectric layer 110. For example, the removal process may be a CMP process that removes portions of the blanket second ferromagnetic layer 600 and portions of the blanket tunnel barrier layer 500 until the underneath second dielectric layer 110 is exposed, thereby forming tunnel barrier layers 501 and 502 and second ferromagnetic layers 601 and 602. As being demonstratively illustrated in FIG. 10, the second ferromagnetic layers 601 and 602 have a sidewall that is not coplanar with a sidewall of the first ferromagnetic layers 401 and 402. In one embodiment, sidewalls of the second ferromagnetic layers 601 and 602 may be angled relative to the bottom surfaces of the second ferromagnetic layers 601 and 602 to have an obtuse angle ranging from about 120 degrees to about 150 degrees.

In one embodiment, the first ferromagnetic layers 401 and 402 may be or may function as a reference layer and the second ferromagnetic layers 601 and 602 may be or may function as a free layer of the MTJ stacks 510 and 520 respectively. In another embodiment, the first ferromagnetic layers 401 and 402 may be or may function as a free layer and the second ferromagnetic layers 601 and 602 may be or may function as a reference layer of the MTJ stacks 510 and 520 respectively.

Figure 11:
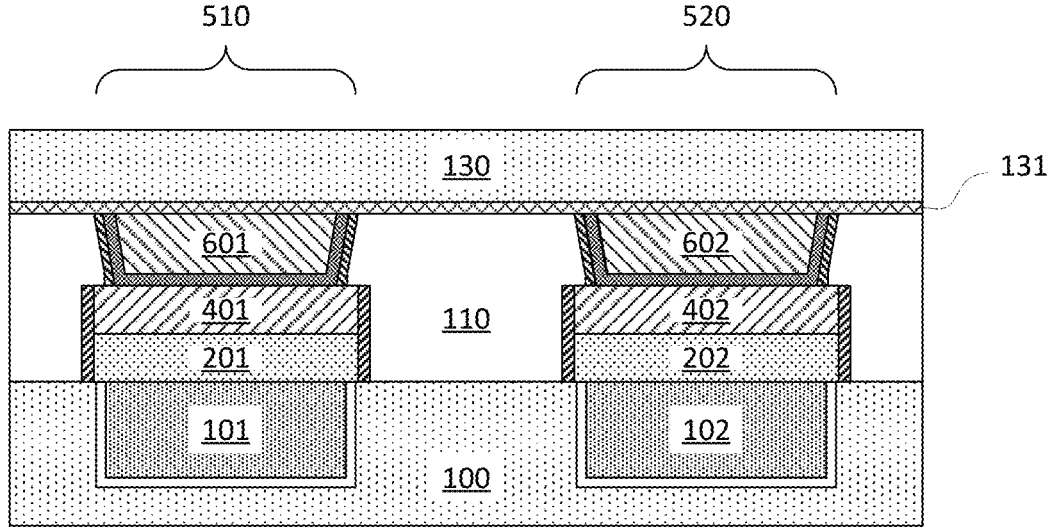

FIG. 11 is a demonstrative illustration of cross-sectional view of a MRAM structure in a step of manufacturing thereof, following the step illustrated in FIG. 10, according to one embodiment of present invention. Following the formation of the second ferromagnetic layers 601 and 602, embodiments of present invention proceed to form top electrodes of the MTJ stacks 510 and 520 of the MRAM structure 10. More particularly, embodiments of present invention provide forming an etch-stop layer 131 on top of the second ferromagnetic layers 601 and 602 and the top surface of the exposed second dielectric layer 110. In one embodiment, the etch-stop layer 131 may be optional. Embodiments of present invention further provide forming a third dielectric layer 130. The third dielectric layer 130 may be a low-k interlevel dielectric (ILD) layer, covering the optional etch-stop layer 131 or the second ferromagnetic layers 601 and 602 and the exposed second dielectric layer 110.

Figure 12:
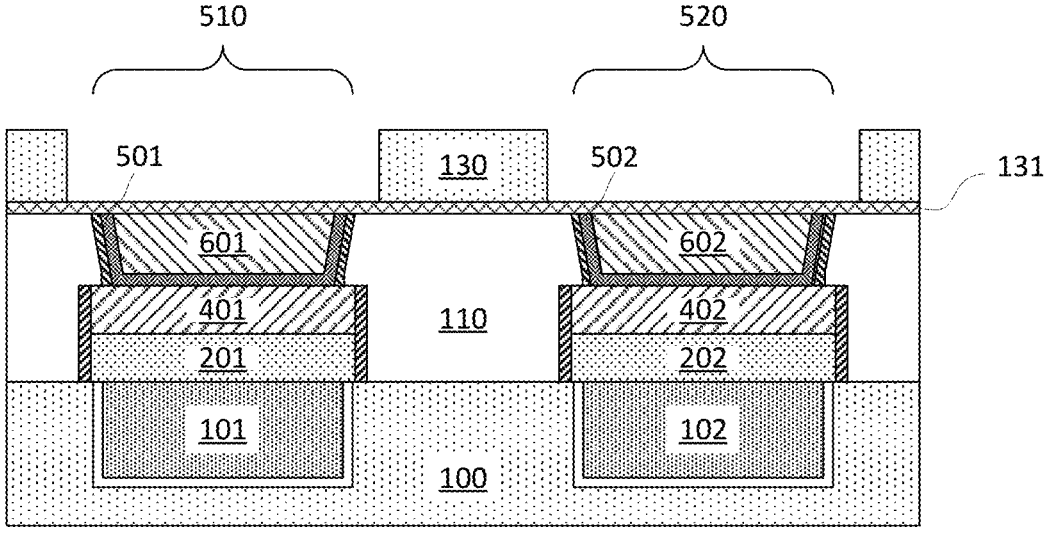

FIG. 12 is a demonstrative illustration of cross-sectional view of a MRAM structure in a step of manufacturing thereof, following the step illustrated in FIG. 11, according to one embodiment of present invention. More particularly, embodiments of present invention provide creating openings in the third dielectric layer 130 to form top electrode layers.

The openings may expose the top surfaces of the etch-stop layer 131 that are directly on top of the second ferromagnetic layers 601 and 602. In one embodiment, the openings may directly expose the top surfaces of the second ferromagnetic layers 601 and 602 when the etch-stop layer 131 is not used.

Figure 13:
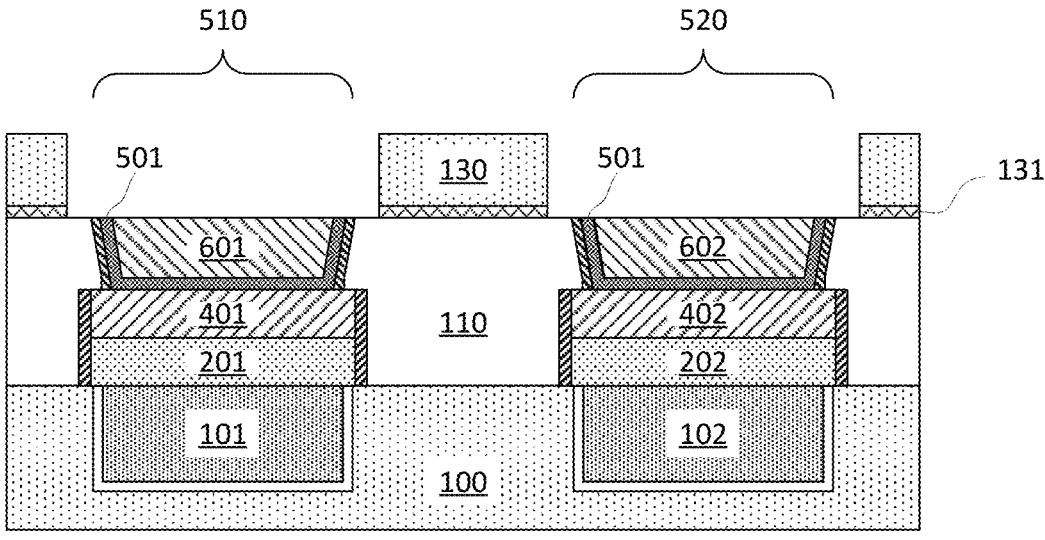

FIG. 13 is a demonstrative illustration of cross-sectional view of a MRAM structure in a step of manufacturing thereof, following the step illustrated in FIG. 12, according to one embodiment of present invention. More particularly, when the etch-stop layer 131 is used, embodiments of present invention provide selectively removing the etch-stop layer 131 that are exposed by the openings to expose the underneath second ferromagnetic layers 601 and 602. In this case, the use of the etch-stop layer 131 provides better control of possible gauging of the second dielectric layer 110 when creating openings in the third dielectric layer 130. For example, when the etch-stop layer 131 is not used and when the openings in the third dielectric layer 130 are made larger than the underneath second ferromagnetic layers 601 and 602 and the surrounding tunnel barrier layers 501 and 502, gauging or over-etching may happen in the second dielectric layer 110 immediately around the tunnel barrier layers 501 and 502. The use of the etch-stop layer 131 mitigates this potential gauging and/or over-etching issue.

Figure 14:
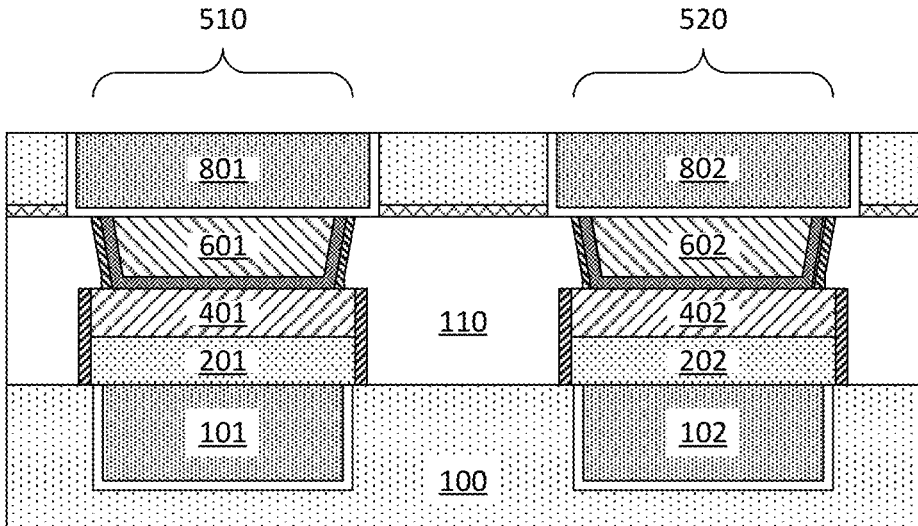

FIG. 14 is a demonstrative illustration of cross-sectional view of a MRAM structure in a step of manufacturing thereof, following the step illustrated in FIG. 13, according to one embodiment of present invention. Embodiments of present invention provide depositing conductive materials such as, for example, tungsten (W), copper (Cu), or aluminum (Al), cobalt (Co), or ruthenium (Ru) in the openings of the third dielectric layer 130 to form top electrode such as top electrode layers 801 and 802. The top electrode layers 801 and 802 may include liners lining the openings surrounded by the third dielectric layer 130 before the conductive materials are deposited.

FIGS. 15-20 are demonstrative illustrations of cross-sectional views of a MRAM structure in a process of manufacturing thereof, following the steps illustrated in FIGS. 1-8, according to another embodiment of present invention.

Figure 15:
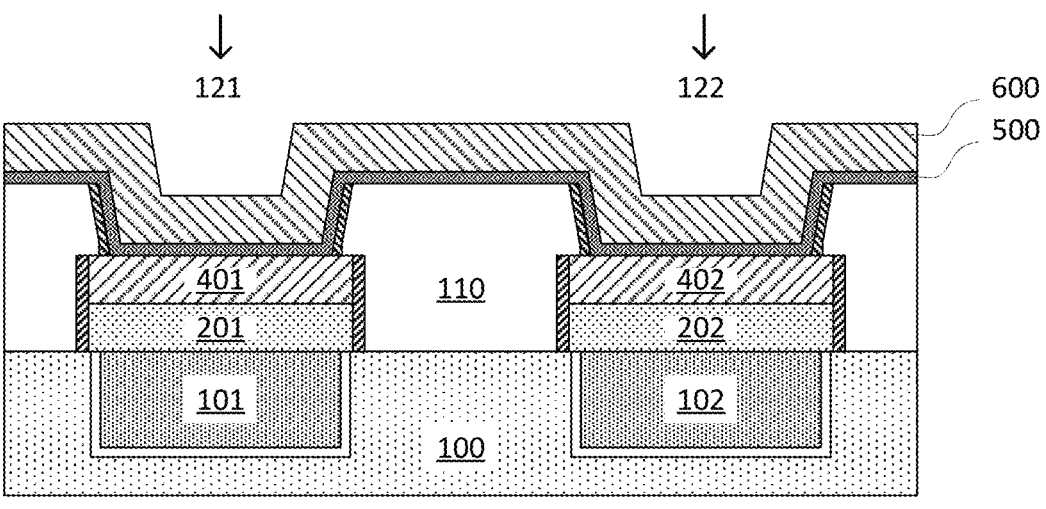
FIGS. 15-20 are demonstrative illustrations of cross-sectional views of a MRAM structure in a process of manufacturing thereof, following the steps illustrated in FIGS. 1-8, according to another embodiment of present invention.

More particularly, FIG. 15 is a demonstrative illustration of cross-sectional view of a MRAM structure in a step of manufacturing thereof, following the step illustrated in FIG. 8, according to another embodiment of present invention. After the blanket tunnel barrier layer 500 is formed on top of the first ferromagnetic layers 401 and 402, lining sidewalls of the openings 121 and 122, and on top of the second dielectric layer 110, embodiments of present invention provide forming a blanket second ferromagnetic layer 600 on top of the blanket tunnel barrier layer 500. In one embodiment, the blanket second ferromagnetic layer 600 may conformally fill the openings 121 and 122, as is illustrated in FIG. 15, to have a top surface that has a non-planar topology. However, embodiments of the present invention are not limited in this aspect and the blanket second ferromagnetic layer 600 may be formed conformally or non-conformally to have a generally flat top surface as well. Any remaining topology of the top surface of the blanket second ferromagnetic layer 600 may subsequently be filled out by a next formed metal hard mask layer, as being described below in more details.

Figure 16:
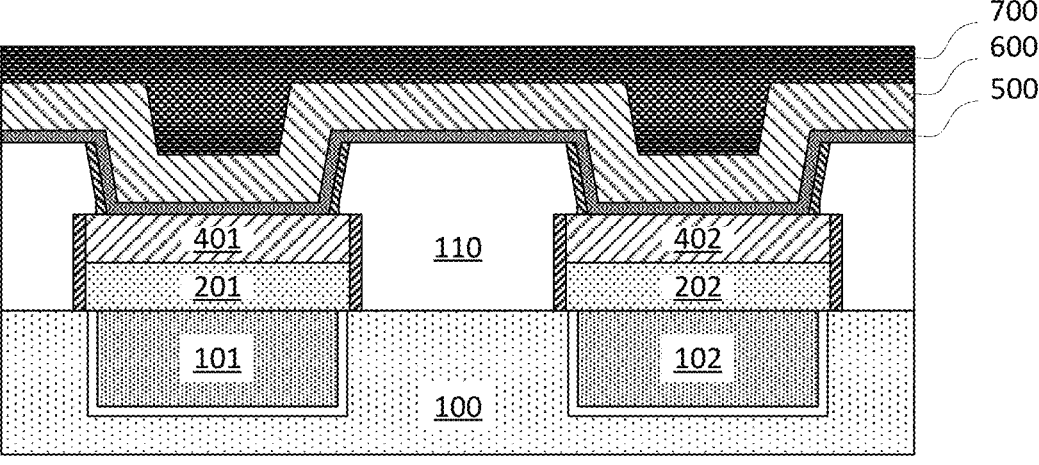

FIG. 16 is a demonstrative illustration of cross-sectional view of a MRAM structure in a step of manufacturing thereof, following the step illustrated in FIG. 15, according to one embodiment of present invention. More particularly, embodiments of present invention provide forming a blanket metal hard mask layer 700 on top of the blanket second ferromagnetic layer 600. The blanket metal hard mask layer 700 may cover any topology that the top surface of the blanket second ferromagnetic layer 600 may have. In one embodiment, the blanket metal hard mask layer 700 may be formed to have a flat top surface, for example by applying a CMP process, and may be made ready for a next lithographic patterning process.

Figure 17:
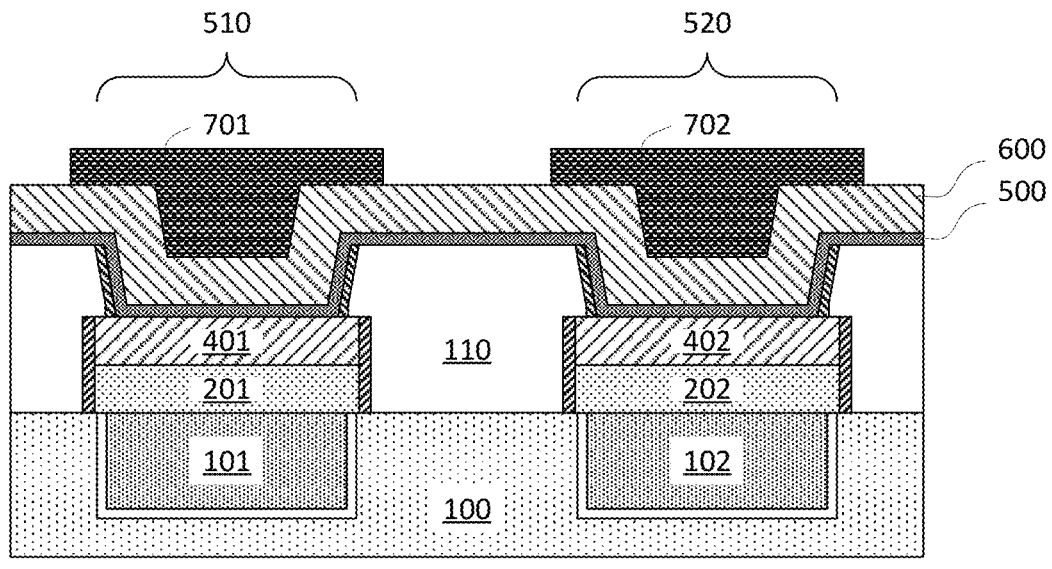

FIG. 17 is a demonstrative illustration of cross-sectional view of a MRAM structure in a step of manufacturing thereof, following the step illustrated in FIG. 16, according to one embodiment of present invention. More particularly, embodiments of present invention provide patterning the blanket metal hard mask layer 700 into metal hard masks 701 and 702 that correspond to the MTJ stacks 510 and 520. The patterning process may be a lithographic patterning process wherein photoresist is used to create a pattern of the metal hard masks, and the pattern of photoresist is then transferred, for example, in a reactive-ion-etching (RIE) etching process or an ion-beam-etching (IBE) to the blanket metal hard mask layer 700 thereby creating the metal hard masks 701 and 702.

Figure 18:
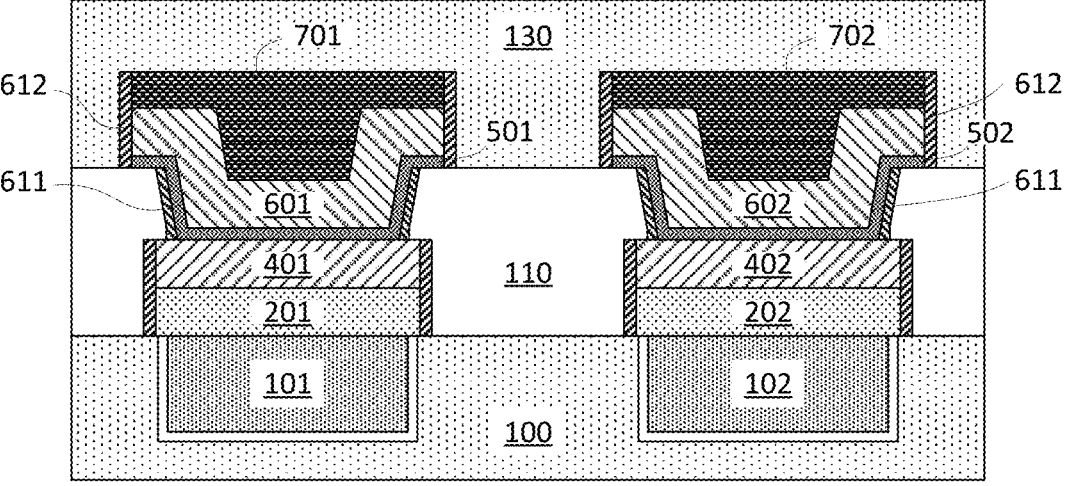

FIG. 18 is a demonstrative illustration of cross-sectional view of a MRAM structure in a step of manufacturing thereof, following the step illustrated in FIG. 17, according to one embodiment of present invention. More particularly, embodiments of present invention provide using the metal hard masks 701 and 702 to etch the blanket second ferromagnetic layer 600 and the underneath blanket tunnel barrier layer 500. The etching transforms the blanket second ferromagnetic layer 600 and the underneath blanket tunnel barrier layer 500 respectively into second ferromagnetic layers 601, 602 and tunnel barrier layers 501, 502.

As is demonstratively illustrated in FIG. 18, the second ferromagnetic layers 601 and 602 have a sidewall that has a first portion (a lower portion) 611 and a second portion (an upper portion) 612. The first portion (lower portion) 611 of the sidewall of the second ferromagnetic layers 601 and 602 is within the openings 121 and 122 of the second dielectric layer 110 and is surrounded by a peripheral portion of the tunnel barrier layers 501 and 502, which in-turn is surrounded by the first sidewall spacer 509. The second portion (upper portion) 612 of the sidewall of the second ferromagnetic layers 601 and 602 is above a level of the second dielectric layer 110; is not surrounded by the tunnel barrier layers 501 and 502; and is not coplanar with the first portion (lower portion) 611 of the sidewall of the second ferromagnetic layers 601 and 602.

Because of the elevated position of the blanket tunnel barrier layer 500 in the area above the second dielectric layer 110, by virtue of the use of openings in the second dielectric layer 110, as compared with a position that otherwise is directly above a first ferromagnetic layer as is common in the prior art, the etching process of the blanket second ferromagnetic layer 600 and the underneath blanket tunnel barrier layer 500 becomes more tolerant to possible gauging of the etching into the second dielectric layer 110. In other words, because of the raised edge of the tunnel barrier layer through the openings made in the second dielectric layer 110, the second dielectric layer 110 has now an elevated thickness that is more forgiven to some potential gauging due to etching of the blanket second ferromagnetic layer 600 and the underneath blanket tunnel barrier layer 500. This is because, according to one embodiment of present invention, the bottom electrode layers 201 and 202, which is the source of re-sputtering causing short, is further distanced from the top surface of the second dielectric layer 110.

Embodiments of present invention further provide, after the etching, forming second sidewall spacers to cover sidewall surfaces of the second ferromagnetic layers 601 and 602 and the tunnel barrier layers 501 and 502. The second sidewall spacers may cover the sidewall surfaces of the metal hard masks 701 and 702 as well. Subsequently, a third dielectric layer 130 may be formed, such as through deposition. The third dielectric layer 130 may cover the stack of the metal hard masks 701, 702, the second ferromagnetic layers 601, 602, and the tunnel barrier layers 501, 502. The third dielectric layer 130 may be deposited to have a thickness, above the metal hard masks 701 and 702, sufficient for forming top electrodes therein as being described below in more details.

Figure 19:
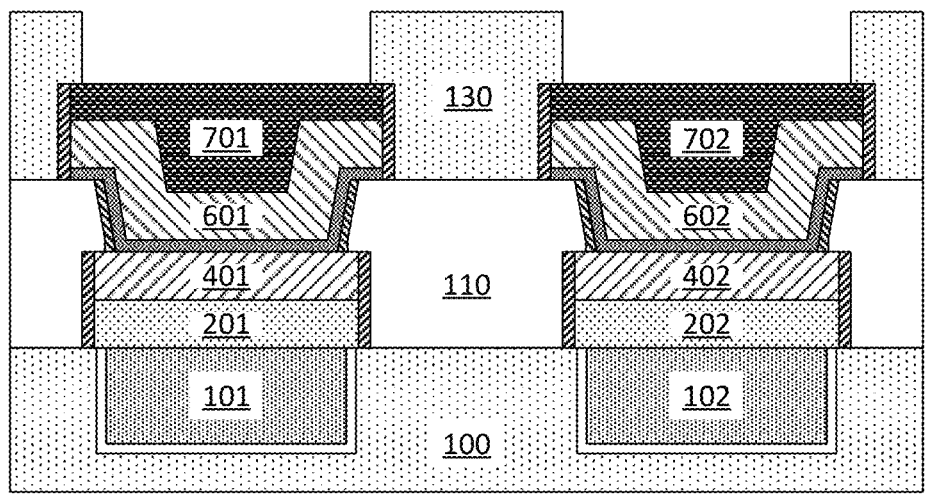

FIG. 19 is a demonstrative illustration of cross-sectional view of a MRAM structure in a step of manufacturing thereof, following the step illustrated in FIG. 18, according to one embodiment of present invention. More particularly, embodiments of present invention provide creating openings inside the third dielectric layer 130 directly above the metal hard masks 701 and 702 to expose a portion of the metal hard masks 701 and 702.

Figure 20:
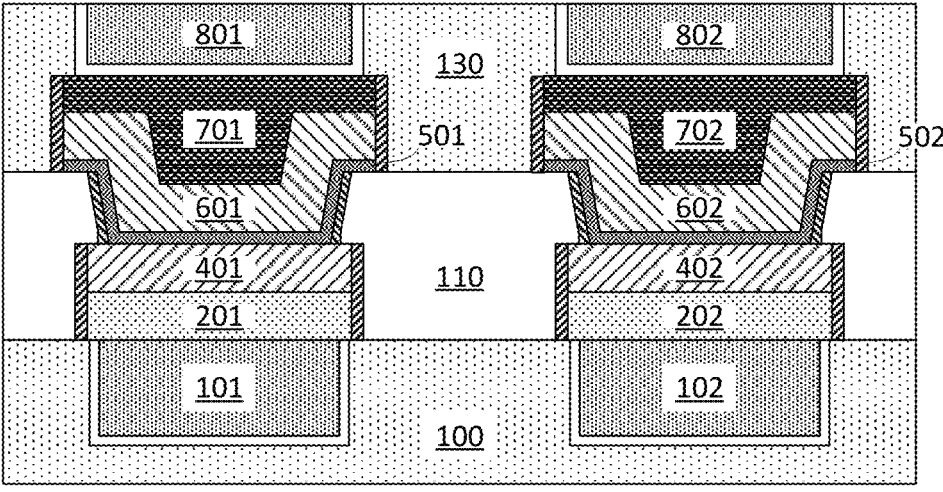

FIG. 20 is a demonstrative illustration of cross-sectional view of a MRAM structure in a step of manufacturing thereof, following the step illustrated in FIG. 19, according to one embodiment of present invention. More particularly, embodiments of present invention provide depositing conductive materials such as, for example, W, Cu, Al, Co, or Ru in the openings of the third dielectric layer 130 to form top electrode such as top electrode layers 801 and 802. The top electrode layers 801 and 802 may include liners lining the openings before the conductive materials are deposited.

FIG. 21 is a demonstrative illustration of a flow-chart of a method of manufacturing a MRAM device according to embodiments of present invention. The method includes (910) forming a bottom electrode and a first ferromagnetic layer of a MTJ stack of a MRAM structure on top of a bottom metal level; (920) forming a dielectric layer on top of the first ferromagnetic layer; (930) creating an opening in the dielectric layer to expose a top surface of the first ferromagnetic layer; (940) forming a tunnel barrier layer inside the opening to cover the top surface of the first ferromagnetic layer and sidewalls of the opening, the tunnel barrier layer also covers top surfaces of the dielectric layer; (950) forming a second ferromagnetic layer on top of the tunnel barrier layer, the second ferromagnetic layer and the tunnel barrier layer have raised edge compared with a central portion thereof at the opening; (960) patterning the second ferromagnetic layer and the tunnel barrier layer through either a CMP process or an etching process, wherein the raised edge of the second ferromagnetic layer and the tunnel barrier layer helps ease concerns of gauging caused by the etching; (970) forming another dielectric layer covering the second ferromagnetic layer; and (980) creating an opening in the another dielectric layer and filling the opening with conductive material to form a top electrode layer.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A MRAM structure comprising:
a magnetic tunnel junction (MTJ) stack, the MTJ stack comprising, vertically from a bottom to a top thereof, a bottom electrode layer, a first ferromagnetic layer, a tunnel barrier layer, a sidewall spacer, a second ferromagnetic layer, and a top electrode layer,
wherein the second ferromagnetic layer is directly on top of the tunnel barrier layer and has a sidewall, a central portion of the tunnel barrier layer is directly on top of the first ferromagnetic layer, and a peripheral portion of the tunnel barrier layer surrounds at least a lower portion of the sidewall of the second ferromagnetic layer and is surrounded by the sidewall spacer, and
wherein the first ferromagnetic layer has a sidewall and a conformal liner covers the sidewall of the first ferromagnetic layer.

2. The MRAM structure of claim 1, wherein the sidewall of the first ferromagnetic layer is not coplanar with the sidewall of the second ferromagnetic layer.

3. The MRAM structure of claim 1, wherein the sidewall of the second ferromagnetic layer is angled relative to a bottom surface of the second ferromagnetic layer, forming an obtuse angle between about 120 degrees and about 150 degrees.

4. The MRAM structure of claim 1, wherein the first ferromagnetic layer is a reference layer and the second ferromagnetic layer is a free layer.

5. The MRAM structure of claim 1, wherein the first ferromagnetic layer is a free layer and the second ferromagnetic layer is a reference layer.

6. The MRAM structure of claim 1, wherein the sidewall of the second ferromagnetic layer has an upper portion that is not surrounded by the tunnel barrier layer and is not coplanar with the lower portion of the sidewall of the second ferromagnetic layer.

7. The MRAM structure of claim 6, further comprising a metal hard mask layer between the second ferromagnetic layer and the top electrode layer.

8. A MRAM structure comprising:
a magnetic tunnel junction (MTJ) stack, the MTJ stack comprising a bottom electrode layer, a first ferromagnetic layer, a tunnel barrier layer, a sidewall spacer, a second ferromagnetic layer, and a top electrode layer,
wherein the second ferromagnetic layer has a sidewall, and the tunnel barrier layer has a central portion and a peripheral portion, the central portion being directly on top of the first ferromagnetic layer and the peripheral portion surrounding at least a lower portion of the sidewall of the second ferromagnetic layer and being surrounded by the sidewall spacer, and
wherein the first ferromagnetic layer has a sidewall and a conformal liner covers the sidewall of the first ferromagnetic layer.

9. The MRAM structure of claim 8, wherein the sidewall of the second ferromagnetic layer has an upper portion, the upper portion being not coplanar with the lower portion of the sidewall of the second ferromagnetic layer.

10. The MRAM structure of claim 8, wherein the sidewall of the first ferromagnetic layer is not coplanar with the lower portion of the sidewall of the second ferromagnetic layer.

11. The MRAM structure of claim 8, wherein the second ferromagnetic layer has a non-planar top surface.

12. The MRAM structure of claim 8, wherein the first ferromagnetic layer is either a reference layer or a free layer.

13. A method of forming a MRAM structure, the method comprising:
patterning a bottom electrode layer and a first ferromagnetic layer on top of the bottom electrode layer;
depositing a dielectric layer, the dielectric layer covering the bottom electrode layer and the first ferromagnetic layer;
creating an opening in the dielectric layer, the opening exposing a portion of the first ferromagnetic layer;
forming a sidewall spacer at a sidewall of the opening;
forming a tunnel barrier layer inside the opening;
forming a second ferromagnetic layer on top of the tunnel barrier layer;
patterning the tunnel barrier layer and the second ferromagnetic layer; and
forming a top electrode layer on top of the second ferromagnetic layer,
wherein the second ferromagnetic layer has a sidewall and the tunnel barrier layer has a central portion and a peripheral portion, the central portion being directly on top of the first ferromagnetic layer and the peripheral portion surrounding at least a lower portion of the sidewall of the second ferromagnetic layer and being surrounded by the sidewall spacer, and the first ferromagnetic layer has a sidewall and a conformal liner covers the sidewall of the first ferromagnetic layer.

14. The method of claim 13, wherein forming the tunnel barrier layer comprises forming the central portion of the tunnel barrier layer on top of the exposed portion of the first ferromagnetic layer and forming the peripheral portion of the tunnel barrier layer against the sidewall of the opening in the dielectric layer, wherein the sidewall of the opening is angled relative to the exposed portion of the first ferromagnetic layer to have an obtuse angle between about 120 degrees to about 150 degrees.

15. The method of claim 13, wherein patterning the tunnel barrier layer and the second ferromagnetic layer comprises applying a chemical-mechanic-polishing process to remove portions of the second ferromagnetic layer and the tunnel barrier layer that are above a top surface of the dielectric layer.

16. The method of claim 13, wherein patterning the tunnel barrier layer and the second ferromagnetic layer comprises forming a metal hard mask layer covering a portion of the second ferromagnetic layer and the tunnel barrier layer, and selectively removing the second ferromagnetic layer and the tunnel barrier layer not covered by the metal hard mask layer through an anisotropic etching process.

\* \* \* \* \*